United States Patent [19]

Adamic, Jr.

[11] 3,753,806

[45] Aug. 21, 1973

[54] INCREASING FIELD INVERSION VOLTAGE OF METAL OXIDE ON SILICON INTEGRATED CIRCUITS

[75] Inventor: Joseph W. Adamic, Jr., Phoeniz, Ariz.

[73] Assignee: Motorola, Inc., Franklin Park, Ill.

[22] Filed: Sept. 23, 1970

[21] Appl. No.: 74,634

[52] U.S. Cl. .............................. 148/188, 317/235 B

[51] Int. Cl. .............................. H01l 7/34

[58] Field of Search ................. 148/188; 317/235 R, 317/235 B

[56] References Cited

UNITED STATES PATENTS

| | | | |
|---|---|---|---|
| 3,450,961 | 6/1969 | Tsai | 317/235 G |
| 3,528,168 | 9/1970 | Adamic, Jr. | 317/235 B |
| 3,532,945 | 10/1970 | Weckler | 317/235 AM |
| 3,607,469 | 9/1971 | Madden | 148/186 |
| 3,440,502 | 4/1969 | Lin et al. | 317/235 G |
| 3,577,043 | 5/1971 | Cook | 317/235 R |
| 3,575,742 | 4/1971 | Gilbert | 148/187 |
| 3,475,234 | 10/1969 | Kerwin et al. | 148/187 |
| 3,544,399 | 12/1970 | Dill | 148/187 |

*Primary Examiner*—L. Dewayne Rutledge
*Assistant Examiner*—J. M. Davis
*Attorney*—Mueller and Aichele

[57] ABSTRACT

When several metal oxide insulated gate field effect transistors are put on a doped silicon substrate and the interconnection leads to the transistors run along the surface of the silicon substrate, being insulated therefrom, the silicon material between the source or drain area of the substrate for one transistor and the source or drain of another transistor may act as a channel between such other sources or drains. This channel may be turned on by the voltage applied to the gate connection or lead, causing improper operation of the several transistors. To prevent this, the surface of the doped silicon is more highly doped between the sources and drains of adjacent transistors than it is at the channel area of the substrate for the several transistors. This may be accomplished by applying a doped silicon dioxide or glass over the whole surface of the doped silicon substrate, this doped glass then being removed from the channel areas of the substrate.

4 Claims, 12 Drawing Figures

Figure 1:
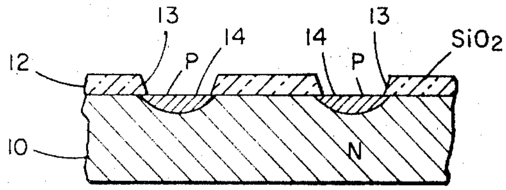

INVENTOR.
Joseph W. Adamic Jr.

BY

ATTY'S

INVENTOR.
Joseph W. Adamic Jr.
BY
ATTY'S

INCREASING FIELD INVERSION VOLTAGE OF METAL OXIDE ON SILICON INTEGRATED CIRCUITS

BACKGROUND

When applying several metal oxide silicon (hereinafter MOS) transistors to the surface of a doped silicon substrate, opposite doping is applied to adjacent areas of the substrate. One of these oppositely doped areas may be the drain and the other area may be the source and the doped silicon between the drain and the source may be the channel of the MOS transistor. Then a layer of insulation is applied over the surface of the substrate, except that holes are provided in the layer of insulation for providing connections to the source and the drain and for defining the channel region. The connections for the source and drain extend into the holes and make connection to the source and drain areas respectively. A layer of insulation is applied over the channel area and then the gate electrode is applied over the insulation, in fact, the gate electrode may overlap the adjacent edges of the drain and source but will be insulated therefrom. The connection to the gate electrode will lie on the insulation layer and be separated from the doped substrate only by the thickness of the insulation layer. Since the substrate extends from one MOS transistor to another, if the voltage applied to the gate connection is high enough, the doped substrate between MOS transistors may act as channels between adjacent MOS transistors, becoming conductive and causing improper operation of the several transistors on the chip. Also, when high enough voltages are applied to the several leads to the transistor, one of said leads may cause a part of the substrate which is not intended to be a channel to act as a channel. A known way of preventing a portion of the surface of a substrate which should not act as a channel from so acting is to make a layer of insulation by which a transistor lead is separated from the surface of the substrate sufficiently thick. This solution of this problem results in a thickness of the insulating layer so great that it is difficult to etch through said layer in a controlled manner. Also, due to the depth of the holes in the insulation, it is difficult to make continuous connections between the diffusions in the substrate and the leads.

Still another way of preventing a portion of the substrate which should not act as a channel from so acting is to etch through the surface insulator and by a diffusion step provide a heavily doped interrupting region in the surface of the substrate where the surface should not act as a channel. This method requires additional masking, etching and diffusion steps.

It is an object of this invention to provide a method for producing an integrated circuit (hereinafter IC) comprising a doped substrate on which at least one MOS transistor is applied and in which a highly doped interrupting region for preventing the portions of the substrate that should not act as channels from so acting is provided, the method requiring less steps than the known method.

SUMMARY

In accordance with the invention, that portion of the surface of the doped substrate that is not to act as a channel is more highly doped with the same type of doping as the doping of the substrate by the selective application of a doped glass on the surface of the substrate, the doping of the glass being the same type as the doping of the substrate, whereby the surface layer that is not to act as the channel is so highly doped that when the voltage on the various leads change, the current in the highly doped area of the substrate cannot change in response to this change of voltage on the leads. Thereby, the change in voltage on the gate leads (for example) result in change of current in their respective channels and not in other portions of the surface of the IC, and change in voltage on a drain lead does not cause other parts of the surface of the chip to act as a channel. The method of this invention produces the channel preventing region and uses less steps than the known method for producing a channel interrupting region.

DESCRIPTION

Figure 4:
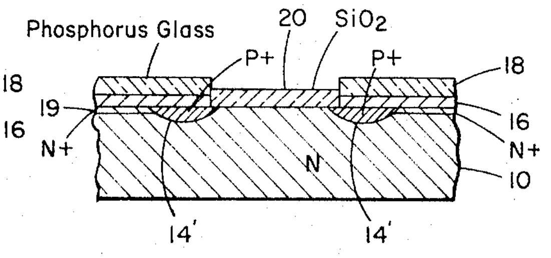
Figures 5, 6, 7:
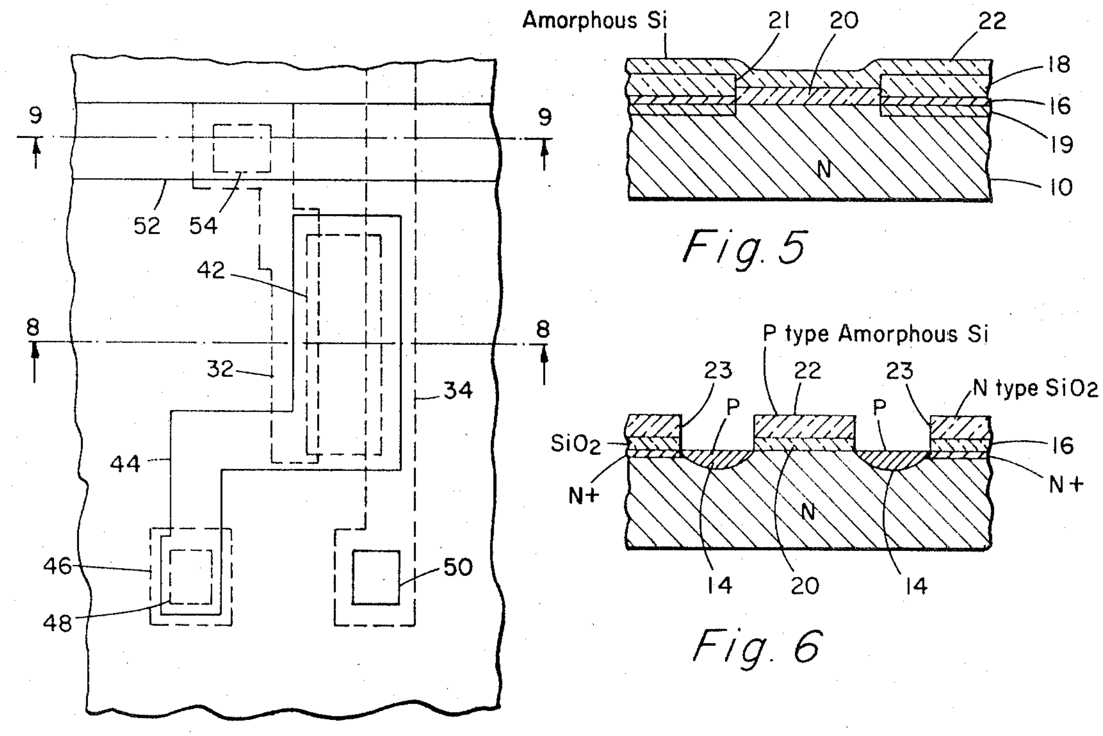
Figure 8:
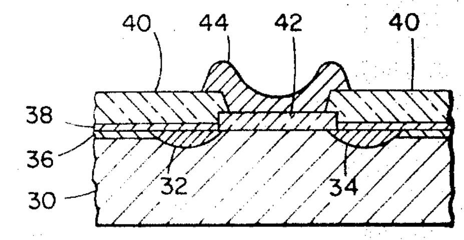
Figure 9:
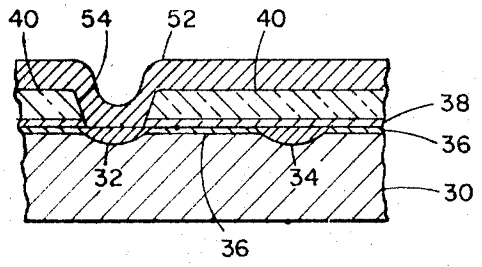
Figure 10:
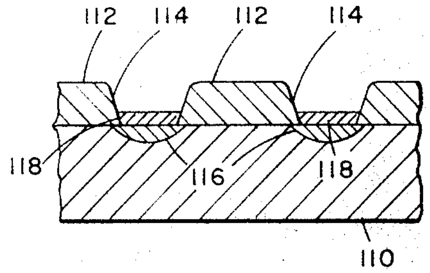
Figure 11:
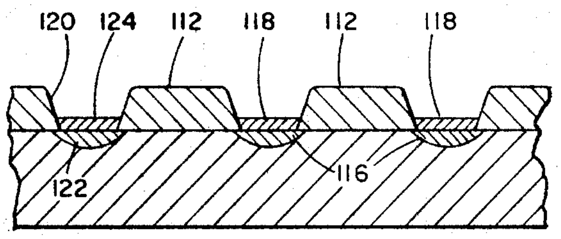
Figure 12:
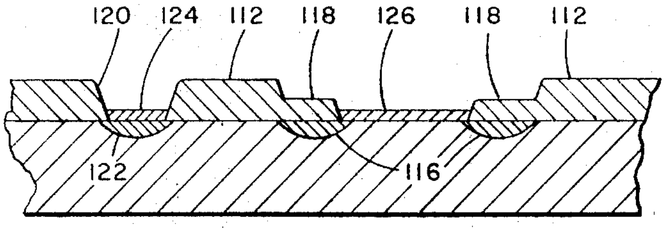

The invention will be better understood upon reading the following description in connection with the accompanying drawing in which FIGS. 1 to 4 illustrate steps in a method of this invention of making a chip including MOS transistors, FIGS. 5 and 6 illustrate a modified method of this invention of making the MOS transistors on a chip, FIG. 7 is a plan view of a portion of an IC of this invention and including a MOS transistor and showing source, drain and gate lead connections, FIGS. 8 and 9 are sections of FIG. 7 on lines 8, 8 and 9, 9 respectively and FIGS. 10, 11 and 12 illustrate a known method of applying highly doped interrupting regions to a substrate.

Turning first to FIG. 10, an N type substrate 110 is provided. Insulating material 112 is applied to the whole surface thereof and holes 114 are etched in the insulation 112 in a known manner as by applying a masking photoresist to the surface of the insulation 112 and etching out the holes 114. P type material is diffused into the substrate 110 to produce the P areas 116 in a known manner. During this process an insulating $SiO_2$ layer 118 grows on each of the P areas 116. Then, turning to FIG. 11, another masking and etching step is performed and the hole 120 is etched at a position and of such length and shape as is necessary to produce the required interrupting channel. Then N type material is diffused into the hole 120 producing the N+ region 122. The P type regions 116 remain P type and the $SiO_2$ layer 124 grows on the interrupting channel 122 and the layers 118 become somewhat thicker. Then see FIG. 12, the material 112 between the P regions 116 where the channel of the MOS transistor is to be is etched out and a gate insulation layer 126 is produced by heating the assembly of FIG. 12 in $O_2$. The MOS transistor of FIG. 12 can be completed by making holes in the insulating layers 118 and making contact to the P regions 116 and by applying a conductive layer to the gate insulation 126. It is noted that a special masking, etching and diffusing step is required to produce the N+ interrupting region 122.

In accordance with this invention see FIG. 1, a chip 10 0f N doped silicon is provided. A layer of glass, that is $SiO_2$, 12 is applied to the upper surface thereof in any known manner and holes 13 are provided in the $SiO_2$ layer. Then P-type doping material is diffused into the N substrate 10 through the hole 13, 13 producing separate P regions 14, 14 in the surface of the N doped silicon chip 10.

Figure 2:
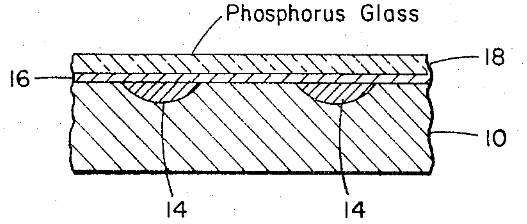
Figure 3:
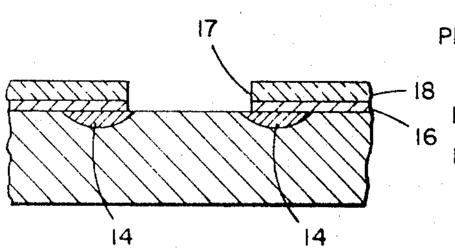

Then the glass 12 is removed in any known manner and a very thin layer 16 of $SiO_2$ is spread over the surface of the chip, see FIG. 2. This layer may be about 500 angstrom units thick. Then, see FIG. 2, $SiO_2$ or glass 18 which is about 10,000 angstrom units thick and which is doped with phosphorus, which is an N dopant, is applied to the whole surface of the chip 10. Then, see FIG. 3, a hole 17 is cut in the layers 16 and 18 between the doped areas 14, 14. Then, see FIG. 4, the chip is heated at about 1,115°C for 1½ hours. During this heating time, the phosphorus in the glass 18 diffuses through the thin glass layer 16 into the top 19 of the chip 10 making the previously N surface 19 of the chip 10 under the glass 18 N+. This N+ layer 19 is the interrupting region and is produced without a separate masking etching and diffusion step. The P areas 14 grow during the heating step to the size such as that illustrated by the areas 14' but remain P. The channel between the P areas 14' grows a pure $SiO_2$ layer 20 thereon while being heated, this layer acting as an insulation for the channel.

During this heating step, the phosphorus diffuses through the $SiO_2$ layer 16. While use of the layer 16 makes phosphorus doping of the glass 18 less critical, with careful control of the concentration of the phosphorus in the glass 18, the layer 16 need not be used. The N+ layer 19 has a concentration of about $10^{16}$ to $3 \times 10^{16}$ atoms of phosphorus per cubic inch.

To complete the transistor of FIG. 4, holes (not shown) are cut into the layers 16 and 18 to expose the source and drain regions 14', 14' and electrodes (not shown) are connected to these regions and a gate electrode is deposited on the gate insulation 20 and leads are connected to these electrodes.

Another method according to this invention is illustrated with respect to FIGS. 5 and 6. As shown in FIG. 5, a large hole 21 has been made in the phosphorus glass 18 and in the thin $SiO_2$ layer 16 and the chip 10 has been heated at about 1,115°C for about 1½ hours as before, causing the growth of the interrupting N+ layer 19 and the $SiO_2$ gate insulation layer 20. The region 19 again is produced without an additional masking etching and diffusion step. Then, also as shown in FIG. 5, a layer 22 of amorphous silicon is applied to the whole surface of the chip 10. Then the amorphous silicon 22 is removed from the whole surface of the chip 10 except over the central portion of the insulation 20. Then, as shown in FIG. 6, smaller holes 23 are made in the insulation 20 in the region of the hole 21. Then P type material is diffused into the substrate 10 through the holes 23 and into the amorphous silicon 22 on top of the gate insulation 20, causing the production of the P type source and drain regions 14, 14 and rendering the amorphous silicon 22 on top of the gate insulator 20 sufficiently conductive so that the material 22 can act as a gate electrode.

If desired, the amorphous silicon, remaining on top of the gate insulation layer 20, may extend laterally from the insulation gate 20, whereby, upon diffusion of P material thereinto, this extension may act as a connection to the gate.

To complete the transistor of FIG. 6, a layer of $SiO_2$ insulation (not shown) is put over the entire surface of the chip 10 and electrodes (not shown) are applied to the source and drain regions 14, 14 and leads are connected to those electrodes and to the gate electrodes through holes properly etched in the last mentioned layer of $SiO_2$.

FIGS. 7, 8 and 9 illustrate the problem and the instant inventive solution thereof. In FIGS. 7, 8 and 9, an N type substrate 30 is provided having P type diffusions 32 and 34 therein. As shown in FIGS. 8 and 9, the substrate 30 has an N+ layer 36 on the surface of the substrate 30 except between the P type areas 32 and 34. A thin layer of $SiO_2$ 38 and an N type phosphorus glass layer 40 appear on the surface of the substrate 30 as shown. The N+ layer 36 is under the N type glass 40. A gate insulator 42 is provided over the channel between the P area 32 which may be the source and the P area 34 which may be the drain. An electrode 44 extends over the surface of the glass 40 and is connected to the P diffusion area at 46 by way of a hole 48 in the glass 40. The P drain region 34, as shown in FIG. 7, extends along the chip beyond the channel between the regions 32 and 34 and may be connected to through a hole 50 in the glass 40. The source P region 32 extends away from the gate connection 44 also shown in FIG. 7 and may be connected to a surface conductor 52 through a hole 54 in the glass 40. As shown in both FIGS. 7 and 9, the conductor 52 runs along the surface of the glass 40 and over the P diffusion 34, whereby there is danger that the substrate between the P region 34 and the P region 32 where they are both under the conductor 52 will act as a channel between the region 34 and 32 due to a high enough voltage appearing on the conductor 52. However, as shown in FIG. 9, the N+ material 36 between the P areas 32 and 34 and under the lead 52 prevents this portion of the surface of the chip 30 from acting as a channel.

What is claimed is:

1. A method of producing an insulated gate field effect transistor device having high magnitude field inversion voltage in a body of semiconductor of a first conductivity type including the steps of forming an undoped oxide layer on an entire surface of the body of semiconductor, and forming a doped oxide layer having impurities therein of the first conductivity type on the undoped oxide layer, and diffusing impurities from the doped oxide layer into the body of semiconductor for increasing the surface impurity concentration thereof, the improvement comprising the steps of:

selectively removing a portion of the doped and undoped oxide layers to expose a portion of the body of semiconductor; and growing a gate insulator oxide layer on said exposed portion of the body of semiconductor concurrently with the diffusing of impurities from the doped oxide layer into the body of semiconductor.

2. The method as recited in claim 1 wherein source and drain regions of a second conductivity type are formed in the body of semiconductor before the undoped oxide layer is formed.

3. The method as recited in claim 1 further including the steps of:

forming a layer of amorphous silicon on said gate insulator oxide layer;

forming first and second openings through said layer of amorphous silicon exposing said body of semiconductor; and diffusing impurities of the second conductivity type into said layer of amorphous silicon and into said body of semiconductor through said first and second openings to form source and drain regions.

4. The method as recited in claim 1 wherein said first conductivity type is N-type and said second conductivity type is P-type, and the N-type impurities in the doped oxide layer are phosphorous.

* * * * *